(12) United States Patent
Fuderer

(10) Patent No.: US 6,552,540 B2
(45) Date of Patent: Apr. 22, 2003

(54) MAGNETIC RESONANCE METHOD FOR FORMING A FAST DYNAMIC IMAGE

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/734,776

(22) Filed: Dec. 12, 2000

(65) Prior Publication Data

US 2001/0022516 A1 Sep. 20, 2001

(30) Foreign Application Priority Data

Dec. 15, 1999 (EP) .............................................. 99204328

(51) Int. Cl.[7] ................................................. G01V 3/00
(52) U.S. Cl. ...................................................... 324/309
(58) Field of Search ................................ 324/309, 307, 324/306

(56) References Cited

U.S. PATENT DOCUMENTS 6,289,232 B1 * 9/2001 Jakob et al. ................. 324/307
6,326,786 B1 * 12/2001 Pruessmann et al. ........ 324/309
6,448,771 B1 * 9/2002 Harvey et al. ............... 324/307

OTHER PUBLICATIONS

Pruessmann, Klaas P. et al.; SENSE: Sensitivity Encoding for Fast MRI; 1999; Wiley–Liss, Inc.; 42:952–962.*

* cited by examiner

*Primary Examiner*—Edward Lefkowitz
*Assistant Examiner*—Dixomara Vargas
(74) *Attorney, Agent, or Firm*—John Vodopia

(57) ABSTRACT

Magnetic resonance imaging method and apparatus which employ multiple magnetic resonance signals from an array of multiple sensors or coils for the reconstruction of images. The method is used in fast dynamic MR imaging. Prior to formation of fast dynamic images, a normal magnetic resonance image with a full set of phase encoding steps is acquired for each sensor or coil. A subset of phase encoding trajectories is extracted commensurate with the phase encoding trajectories obtained by the fast dynamic imaging and an image is reconstructed from the subset. Subsequently, the signals of the fast dynamic image are compared with the signals of the reconstructed image, thus yielding an estimate of the fold-over artefacts of the fast dynamic image. The signals of the fold-over artefacts thus compensate the signals obtained by the fast dynamic imaging and deliver a corrected image without artefact parts.

20 Claims, 1 Drawing Sheet

MAGNETIC RESONANCE METHOD FOR FORMING A FAST DYNAMIC IMAGE

BACKGROUND OF THE INVENTION

1. Field of the Invention

The invention relates generally to a magnetic resonance method for forming a fast dynamic image and more particularly to a magnetic resonance method for forming a fast dynamic image from a plurality of signals acquired by an array of multiple sensors wherein prior to imaging, a sensitivity map of each of the sensors is provided, at least two adjacent sensors record signals originating from the same imaging position, which are multiplied by a sensitivity factor of the respective sensor at the respective imaging position while the image intensity is calculated from the signals measured by the various sensors, and the number of phase encoding steps is reduced from a full set. The invention also relates to a magnetic resonance imaging apparatus for obtaining a fast dynamic image from a plurality of signals, including an array of multiple sensors for recording signals, means for scanning the object along phase encoding trajectories, control means for skipping part of the phase encoding trajectories and calculating means for the reconstruction of an image from signals recorded by sensors in different spatial positions with respect to the object to be imaged in order to obtain a fast dynamic image, and to a computer program product stored on a computer usable medium for forming a fast dynamic image using the magnetic resonance method, comprising a computer readable program means for making the computer control the execution of a recording procedure for signals from an array of multiple sensors, a procedure for scanning the object along phase encoding trajectories, a control procedure for skipping part of the phase encoding trajectories, and a calculating procedure for the reconstruction of an image from signals recorded by sensors in different spatial positions with respect to the object to be imaged in order to obtain a fast dynamic image.

2. Description of Related Art

In magnetic resonance imaging there is a general tendency to acquire acceptable images in shorter periods of time. For this reason the Institute of Biomedical Engineering and Medical Informations, University and ETH Zürich, Switzerland have recently developed an encoding method called "SENSE". The SENSE method is based on an algorithm which directly acts on the image as detected by the coils of the magnetic resonance apparatus; subsequent encoding steps can be skipped so that the signal acquisition for imaging can be accelerated by a factor two to three. Crucial for the SENSE method is the knowledge of the sensitivity of the coils which are arranged in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts p. 579, 799, 803 and 2087).

The SENSE method is preferred for acceleration of the signal acquisition for magnetic resonance imaging; this offers an enormous reduction in operating time. However, the method can only be used properly if the coil sensitivity is exactly known. Otherwise imperfections will cause fold-over artefacts which lead to incorrect images. In practice the coil sensitivity cannot be estimated perfectly and will be dependent on fluctuations in time (movement of the patient, temperature influences, etc.).

OBJECTS AND SUMMARY OF THE INVENTION

It is an object of the present invention to reduce to a great extent or even eliminate the fold-over artefacts during fast dynamic imaging.

This and other objects of the invention are achieved by a method in which prior to the formation of the fast dynamic image, a normal magnetic resonance image with the full set of phase encoding steps is acquired for each sensor, a subset of phase encoding trajectories is extracted commensurate with the phase encoding trajectories obtained by the fast dynamic imaging and an image is reconstructed from the subset of phase encoding trajectories, and the signals of the fast dynamic image and the signals of the reconstructed image are compared in order to obtain an estimate of the fold-over artefacts of the fast dynamic image such that the signals of the fold-over artefacts are compensated in the signals obtained by the fast dynamic imaging. This and other objects of the invention are also achieved by an apparatus including means for signal acquisition for a normal magnetic resonance image with a full set of phase encoding steps whereby a subset of phase encoding trajectories is extracted commensurate with the phase encoding trajectories obtained by fast dynamic imaging and an image reconstructed from the above-mentioned subset, calculating means for comparing the signals of the fast dynamic image with the signals of the reconstructed image, thus yielding an estimate of the fold-over artefacts of the fast dynamic image, and compensating means for compensating the signals of the fold-over artefacts in the signals obtained by the fast dynamic imaging. This and other objects of the invention are also achieved by a computer program stored on a computer usable medium for forming a fast dynamic image using a magnetic resonance method comprising a computer readable program means for making the computer control the execution of a signal acquisition procedure for a normal magnetic resonance image with a full set of phase encoding steps whereby a subset of phase encoding trajectories is extracted commensurate with the phase encoding trajectories obtained by fast dynamic imaging and an image reconstructed from the above-mentioned subset, a calculating procedure for comparing the signals of the fast dynamic image with the signals of the reconstructed image, thus yielding an estimate of the fold-over artefacts of the fast dynamic image, and a compensating procedure for compensating the signals of the fold-over artefacts in the signals obtained by the fast dynamic imaging.

The main issue of the present invention is based on the supposition that the shape of the fold-over artefacts varies quite slowly in time, i.e. the previous imperfections from the estimate of the profile of the coil sensitivity will also vary only slowly with respect to the imaging time. The idea of the measuring method is in fact such that an estimate of the artefacts will be acquired, which estimated artefact image may be subtracted from the image provided by fast dynamic imaging. This means that the aforementioned SENSE method can be accelerated since a calibration of the coils in the sense of tedious measuring of sensitivity maps will no longer be necessary.

A further advantage of the method according to the present invention consists in that the estimate of the artefact image is continuously corrected; that is a more precise estimate of the image artefact is obtained iteratively, thus enhancing the quality and reliability of the fast dynamic imaging method. Since the signal-to-noise ratio of the fast dynamic image and that of the artefact image are of the same order of magnitude the signal-to-noise ratio of every corrected fast image will be increased. Namely, the corrected fast image is formed by superposition of the fast dynamic image and the artefact image; hence, if no steps are taken the noise contribution of the artefact image and the fast dynamic image will add vectorially. In order to overcome this problem, another acquisition scheme can be used in that the sampling of sets of profiles during fast dynamic imaging is shifted on step in k-space. This will improve the signal-to-noise ratio, thus yielding a more reliable image.

BRIEF DESCRIPTION OF THE DRAWINGS

These and other advantages of the invention are set forth in the following description in which an exemplified embodiment of the invention is described with reference to the accompanying drawings wherein.

DETAILED DESCRIPTION OF THE INVENTION

Unless otherwise stated, specific numbers dedicated to elements defined with respect to a particular figure will be used consistently in all figures.

Figure 1:
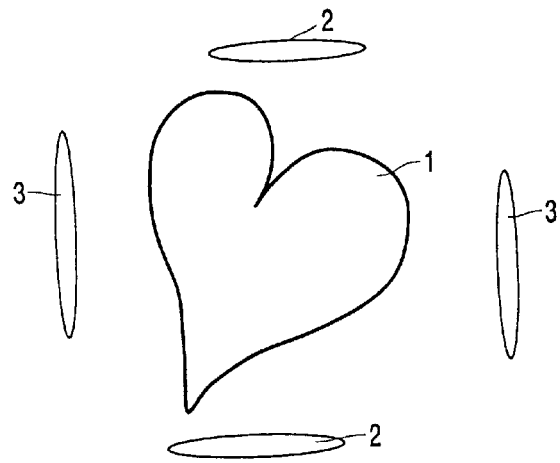
FIG. 1 shows an imaging object with a plurality of sensors or coils.
Figure 2:
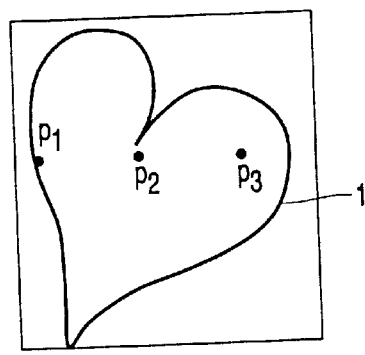
FIG. 2 shows an image of the object acquired by conventional magnetic resonance imaging.
Figure 3:
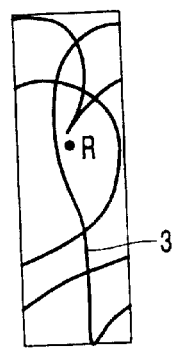
FIG. 3 shows a raw image acquired by a fast dynamic imaging method like SENSE.

FIG. 1 shows an imaging object 1 which is embedded between four sensors or coils 2 and 3 which are arranged to opposite sides of the object 1. Furthermore, the coils 2 are directed perpendicularly to the coils 3. This arrangement can also be modified, for example to a rhombic arrangement. FIG. 2 shows a "normal image" of the object 1 wherein the coordinate points $p_1$, $p_2$ and $p_3$ can be distinguished in that the phase encoding step will be chosen sufficiently small. FIG. 3 shows a raw or folded image of the pixels acquired by a fast dynamic imaging method like SENSE. At the position R the signals of the positions $p_1$, $p_2$ and $p_3$ are summed. As briefly discussed before, the SENSE method is based on the skipping of phase encoding lines during sampling. The images obtained from the different sensors or coils 2 and 3 are initially smeared out. This raw or smeared-out image cannot be used for medical analysis yet and has to be refined to a proper image by calculating the reconstruction from the equations of the measured pixel Values in dependence on the coil sensitivity at the measuring position and the tissue contrast friction at that position (see e.g. Proc. ISMRM, 1998, p. 579). Thus, according to a fast dynamic imaging method like SENSE it is very important to obtain precise sensitivity maps of the used coils.

The imaging method of the present invention in its simplest form can now be described as follows:

a) first there is performed a so called preparation measurement which includes the normal sampling of the image values by using a full set of phase encoding steps with a step magnitude as demanded by the Nyquist formula. From these measured values a normal image according to magnetic resonance imaging is derived.

b) From this measurement a subset of phase encoding trajectories commensurate with the phase encoding trajectories according to the fast dynamic imaging method (SENSE) are extracted and the other lines will be discarded. Generally speaking, the object can be scanned along trajectories in the form of horizontal lines, however, other trajectories like those in a radial or spiral scan can also be used.

c) From the phase encoding trajectories thus extracted an image is reconstructed by the SENSE method.

d) Subsequently, the image values obtained sub c) are subtracted from the normal image values obtained sub a), thus yielding an estimate of the contribution of the artefacts to the image obtained by the SENSE method.

e) Subsequently, one or more SENSE measurements are performed and the estimated artefact-images are subtracted after the reconstruction of the respective images.

This simple method has several restrictions:

a full scan according to normal magnetic resonance imaging is needed before measurement, when the profile of the coil sensitivity changes slowly, for example due to breathing or a change in temperature, the estimate of the artefacts will become incorrect in the long term, the artefact image contains noise of the same order of magnitude as the noise in the image provided by the SENSE method. This noise will increase the noise of the SENSE image corrected by subtraction of the artefact image.

Figure 4:
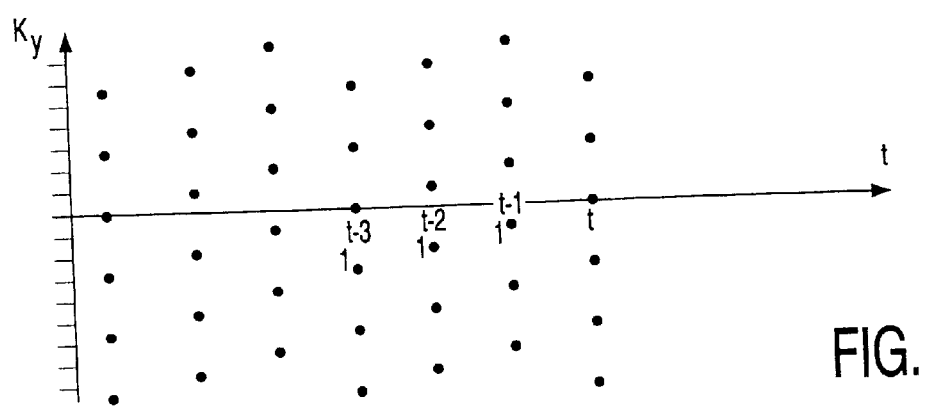
FIG. 4 shows a new acquisition scheme in k-space wherein every set of ky values is shifted a predetermined step in time.

In order to overcome these drawbacks the following, more sophisticated acquisition scheme is proposed:

For every image a reduced set of phase encoding profiles according to the SENSE method is recorded; however, every image is shifted one step in $k_y$-space. In FIG. 4 this acquisition scheme is illustrated in time t. The most interesting aspect is that at the instant $t_1$ there is a set $\{t_1-k, t_1-k+1, \ldots, t_1-2, t_1-1\}$ which contains a complete set of profiles. From these profiles a "normal" reconstruction can be made, i.e. without using the reconstruction under SENSE. By comparison with the SENSE reconstruction of the data at the moment $t_1-k$ an estimate can be made of the artefacts obtained by the SENSE method. These artefact images can be used for the SENSE reconstruction of the data measured at the instant $t_1$.

However, in practice this method is often not accurate enough, since the SENSE artefacts will be corrected, but the artefacts which are introduced by movements (temperature shifts, patient movement, etc.) may be of the same order of magnitude. In addition the contribution of the noise will increase because of the noise in the estimate of the artefact image. The aforementioned method can be advantageously refined as follows: calculation, after every set of k images, of an estimate of the artefact image and formation of an arithmetic mean of all previous versions. This can be calculated, for example, by means of the following formula:

$$A(t)=f \cdot a(t)+(1-f) \cdot A(t-k),$$

wherein:

A(t) is the most recent estimate of the arithmetic mean of the estimates of the artefact images, A(t−k) is the "old" estimate of the arithmetic mean, a(t) is the estimate of the artefact image calculated from the set $\{t-k, t-k+1, \ldots, t-2, t-1\}$ and data at the instant $t_1-k$, and f is a factor controlling the "refreshing speed"; its typical value is less than 0.1.

If the factor f were varied in time as a function of the activity of the image, a further refinement would be obtained. The activity, that is the intensity of movement of the object or change in the object, can be determined by calculating the difference between the data at the instant t and the data at the instant t−k. Thus, one could choose a large value for f in "quiet" periods and the SENSE system would know its own imperfection at that quiet time.

A further possibility exists even if the exact sensitivity profile of the coils is not known, i.e. when normally SENSE reconstructions are not feasible. Using the above mentioned measuring sequence even if the resolution of the image will be reduced, an image at the instant t can be combined with the data obtained at the instants t−1 and t+1, since this set includes the full set of $k_y$ phase encoding steps. This full set of measurements at the instants t−1, t and t+1 can be used as an on-line reference measurement of the coil sensitivity. In fact, for every coil element one can reconstruct a full image, and from the ratios of the pixel signals of the coil elements extracted from this full image there can be derived an estimate of the relative sensitivity for every single pixel. However, this reference measurement will provide possibly more noise as in a preparation measurement or scan as described above. The lower quality of the sensitivity profiles of the coils can be compensated by the more sophisticated measurement schemes.

Since the processing of the reference data will take several seconds, during this time there will be performed a scan, which will show the dynamic sequence with a reduced temporary resolution (i.e. for every instant t a combination of data of t−1, t and t+1 will be used). As soon as the calculation of the coil sensitivity profiles has been completed, the system will switch to the high time resolution measurement according to the SENSE method.

The switching between the reconstruction of the estimate of the artefact images according to this method and the normal SENSE method does not have to be sharp but can also be arranged in a weighted manner:

Suppose that A (x, Y)=FFT (measurement (t−1), measurement (t), measurement (t+1)) and B (x, y)=SENSE (measurement (t)); the definitive image I (x, y)=W (x, y)·A (x, y)+(1−W (x, y))·B (x, y) can then be combined.

Of course, the weighing function W (x, y) equals 1 as long as a SENSE reconstruction is possible. After that the weighing function allows the image to become gradually a SENSE image as a function of the estimate of the accuracy obtained for the coil sensitivity profile. At the end the function W should be regulated to 0. In areas where the SENSE reconstruction method produces insufficient results (for example, in areas with a high signal-to-noise ratio) the weighing function will have a relatively high value.

As an example of the abovementioned method one can imagine the following working sequence, it being assumed that SENSE with an amplification factor of 3 images should be performed every 100 ms; the acquisition of a full set of $k_y$ profiles will thus require only about 300 ms. In this example it is also supposed that the processing of the coil sensitivity data lasts about 3 s.

At the instant t=0 the measurement starts. The slice position in the beginning is, for example, a transverse intersection through the heart.

At the instant t=0.3 s the first image appears; this image, however, contains some movement artefacts because of the temporal resolution. At the same time the calculation of the coil sensitivity profiles commences.

At the instant t=2 s the user decides to vary slowly the slice position and angle in an interactive manner, for example, for localization of the cardiac valve. The calculation of the coil sensitivity profile is stopped. The user receive a fresh image every 0.3 s.

At the instant t=5 s the user briefly stops the interactive action and the images with low temporal resolution of the location appear. Once again the system starts the calculation of the coil sensitivity profiles.

At the instant t=8 s the system in the meantime reconstructs a SENSE image every 100 ms. At the beginning these images contain some imperfections, since the coil sensitivity profiles are derived from images with movement artefacts. However, the artefacts can be estimated better and better and correction according the above-mentioned method will be arranged.

At the instant t=9 s the user decides to change the slice position slightly.

At the instant t=9.3 s images with low temporal resolution are formed again and new coil sensitivity profiles are calculated.

At the instant t=12.3 further SENSE images are produced.

After about 15 s better more and better SENSE images are obtained due to the correction by artefact estimates as shown before.

This procedure offers the major advantage that the user can navigate through the organ to be imaged of the patient while high temporary resolution imaging, i.e. fast dynamic imaging according to the SENSE method, can be realized nevertheless at the interesting position.

Although the described magnetic resonance method for forming a fast dynamic image is directed at first to the SENSE method, other methods of fast sampling and extraction of images, such as the so called SMASH method, can be used for the present invention. The Simultaneous Acquisition of Spatial Harmonics (SMASH) is described in detail, for example, in Magnetic Resonance in Medicine 38, p. 591–603 (1997); this disclosure is explicitly included by reference herein.

The above method for forming a fast dynamic image can be performed by a computer program product which is stored on a computer usable medium so as to control the execution of the various above mentioned procedures.

Thus, the present invention may be embodied in other specific forms or methods without departing from the scope or essential attributes thereof and, accordingly, reference should be made to the appended Claims, rather than to the foregoing specification, as indicating the scope of the invention.

What is claimed is:

1. A magnetic resonance method for forming a fast dynamic image, comprising the steps of:

providing an array of multiple sensors, providing a sensitivity map of each of the sensors prior to imaging, arranging the sensors such that at least two adjacent sensors operatively record signals originating from a common imaging position whereby the signals are multiplied by a sensitivity factor of the respective sensor at the respective imaging position obtained from the sensitivity maps and image intensity is calculated from the signals measured by the sensors, performing fast dynamic imaging to obtain fast dynamic images from a plurality of signals acquired by the sensors while the number of phase encoding steps is reduced from a full set of phase encoding steps, acquiring a normal magnetic resonance image with the full set of phase encoding steps for each sensor prior to formation of the fast dynamic images, extracting a subset of phase encoding trajectories from the normal image acquired prior to formation of the fast dynamic images commensurate with the phase encoding trajectories obtained by the fast dynamic imaging, reconstructing an image from the subset of phase encoding trajectories, comparing the signals of an initial fast dynamic image and the signals of the reconstructed image to obtain an estimate of fold-over artefacts in the initial fast dynamic image, and compensating for the signals of the fold-over artefacts in the signals obtained by the fast dynamic imaging for subsequent fast dynamic images using the estimate of the fold-over artefacts in the initial fast dynamic image to thereby obtain corrected fast dynamic images.

2. A magnetic resonance method according to claim 1, further comprising the step of starting the acquisition of every image:according to the fast dynamic imaging after a shift in k-space by a predetermined constant step in order to compensate for changes of sensitivity of the sensors during imaging.

3. A magnetic resonance method according to claim 2, further comprising the step of modifying the signals of the estimate of the fold-over artefacts in the initial fast dynamic image by a correction factor after acquisition of every fast dynamic image to obtain a revised estimate of the fold-over artefacts.

4. A magnetic resonance method according to claim 3, further comprising the step of multiplying the estimate of the fold-over artefacts by a refreshing factor of between 0 and 1.

5. A magnetic resonance method according to claim 4, further comprising the step of factoring in the previous estimate of the fold-over artefacts when determining the correction factor.

6. A magnetic resonance method according to claim 1, further comprising the step of compensating for changes of sensitivity of the sensors during imaging.

7. A magnetic resonance method according to claim 3, further comprising the steps of:

calculating the revised estimate of the fold-over artefacts from the most recent fast dynamic image; and determining the correction factor based on the calculated revised estimate of the fold-over artefacts.

8. A magnetic resonance method according to claim 1, wherein the array of sensors comprise four sensors, further comprising the step of arranging the four sensors to surround a space in which an object is positionable for imaging.

9. A magnetic resonance method according to claim 1, wherein the array of sensors comprise at least two sensors, further comprising the step of arranging the two sensors on opposite sides of a space in which an object is positionable for imaging.

10. A magnetic resonance method according to claim 1, wherein the step of compensating for the signals of the fold-over artefacts comprises the step of subtracting the estimate of the fold-over artefacts from the subsequent fast dynamic images.

11. A magnetic resonance method for forming a fast dynamic image, comprising the steps of:

arranging an array of sensors such that at least two adjacent sensors operatively record signals originating from a common imaging position whereby the signals are multiplied by a sensitivity factor of the respective sensor at the respective imaging position obtained from predetermined sensitivity maps and image intensity is calculated from the signals measured by the sensors, performing fast dynamic imaging to obtain an initial fast dynamic image from a plurality of signals acquired by the sensors while a number of phase encoding steps is reduced from a full set of phase encoding steps, acquiring a normal magnetic resonance image with the full set of phase encoding steps for each sensor prior to formation of the initial fast dynamic image, extracting a subset of phase encoding trajectories from the normal image commensurate with the phase encoding trajectories obtained by the fast dynamic imaging, reconstructing an image from the subset of phase encoding trajectories, comparing the signals of an initial fast dynamic image and the signals of the reconstructed image to obtain an estimate of fold-over artefacts in the initial fast dynamic image constituting an artefact image, and compensating for fold-over artefacts in subsequent fast dynamic images using the artefact image to thereby obtain corrected fast dynamic images.

12. A magnetic resonance method according to claim 11, wherein the step of compensating for fold-over artefacts comprises the step of subtracting the artefact image from the subsequent fast dynamic images.

13. A magnetic resonance method according to claim 11, further comprising the step of compensating for changes of sensitivity of the sensors during imaging.

14. A magnetic resonance method according to claim 11, further comprising the step of starting the acquisition of every image according to the fast dynamic imaging after a shift in k-space by a predetermined constant step in order to compensate for changes of sensitivity of the sensors during imaging.

15. A magnetic resonance method according to claim 14, further comprising the step of modifying the artefact image by a correction factor after acquisition of every fast dynamic image to obtain a revised artefact image.

16. A magnetic resonance method according to claim 15, further comprising the step of multiplying the artefact image by a refreshing factor of between 0 and 1.

17. A magnetic resonance method according to claim 15, further comprising the step of factoring in the previous artefact image when determining the correction factor.

18. A magnetic resonance method according to claim 15, further comprising the steps of:

calculating the revised artefact image from the most recent fast dynamic image; and determining the correction factor based on the calculated revised estimate of the artefact image.

19. A magnetic resonance method according to claim 11, wherein the array of sensors comprise four sensors, further comprising the step of arranging the four sensors to surround a space in which an object is positionable for imaging.

20. A magnetic resonance method according to claim 11, wherein the array of sensors comprise at least two sensors, further comprising the step of arranging the two sensors on opposite sides of a space in which an object is positionable for imaging.

* * * * *